United States Patent [19]

Andrews

[11] Patent Number: 5,459,737
[45] Date of Patent: Oct. 17, 1995

[54] TEST ACCESS PORT CONTROLLED BUILT IN CURRENT MONITOR FOR IC DEVICES

[75] Inventor: John R. Andrews, Saco, Me.

[73] Assignee: National Semiconductor Corporation, Santa Clara, Calif.

[21] Appl. No.: 87,982

[22] Filed: Jul. 7, 1993

[51] Int. Cl.[6] .................................................. H04B 17/00
[52] U.S. Cl. ........................ 371/22.5; 371/223; 371/22.1; 371/22.6; 371/21.4
[58] Field of Search .................................. 371/22.3, 22.1, 371/22.5, 22.6, 21.4; 365/201; 361/87, 93, 111

[56] References Cited

U.S. PATENT DOCUMENTS

| | | | |
|---|---|---|---|
| 5,025,344 | 6/1991 | Maly et al. | 371/21.4 |
| 5,056,093 | 10/1991 | Whetsel | 371/22.3 |
| 5,254,942 | 10/1993 | D'Souza et al. | 371/22.3 |

OTHER PUBLICATIONS

"IDDQ Benefits" by Steven D. McEuen, Ford Microelectronics Inc., 9965 Federal Drive Colorado Springs, Colo. 80921, published in 1991 IEEE VLSI Test Symposium, Paper 14.1 pp. 285–290.

"Comparing Stuck Fault and Current Testing via CMOS Chip Test", by Tom Storey and Wohceich Maly, Carnegie Melon University, Pittsburgh, Pa. and John Andrews and Myron Miske, National SEmiconductor Corporation, South Portland, Me published at the European Test Conference, Apr. 1991.

"Circuit Design for Built–In Current Testing" by M. Patyra and W. Maly, Carnegie Mellon University, Pittsburgh, Pa. IEEE 1991 Custon Integrated Circuit Conference.

Primary Examiner—Ellis B. Ramirez
Assistant Examiner—Hal D. Wachsman
Attorney, Agent, or Firm—Daniel H. Kane; Stephen R. Robinson; Vincenzo D. Pitruzzella

[57] ABSTRACT

A test access port (TAP) controls monitoring and testing of static current IDDQ in integrated circuit (IC) devices having both a TAP of the type specified in IEEE Standard 1149.1 Test Access Port and Boundary Architecture and built-in current (BIC) monitors. BIC monitors are coupled between MOS or CMOS modules of the IC device and the low potential power rail (GND) for monitoring static current IDDQ. Bypass or shunt MOS transistors (N1,N2, ..., NN) are coupled with primary current paths in parallel with the respective BIC monitors between the CMOS circuit modules and low potential power rail (GND). The TAP data registers (TDR's) include a design specific BIC shunt control TDR (BICSC TDR) constructed for receiving a coded BIC monitor bypass code (BICBC) at the TDI pin. BICSC TDR outputs are coupled to control nodes of the respective MOS bypass transistors (N1,N2, ..., NN) for controlling the conducting state of the bypass transistors according to the BICBC. The MOS bypass transistor provides a low impedance bypass path around the BIC current monitor in response to a first BICBC during normal operation of the IC device and presents a high impedance bypass path in response to a second BICBC for monitoring quiescent IDDQ at the BIC monitor.

18 Claims, 7 Drawing Sheets

TEST ACCESS PORT CONTROLLED BUILT IN CURRENT MONITOR FOR IC DEVICES

TECHNICAL FIELD

This invention relates to a new built-in current monitor (BIC) and method for monitoring and testing quiescent current or static current (IDDQ) through CMOS or MOS circuit portions of an integrated circuit (IC) device. The invention is applicable to IC devices having a standard test access port (TAP) of the type specified in IEEE Standard 1149.1 for Test Access Port and Boundary Scan Architecture and in the protocol of the Joint Test Action Group (JTAG) Version 2.0. The new TAP controlled BIC permits static current measurement and testing of CMOS and MOS modules or macrocells at any time during the life of a chip. The TAP controlled BIC bypasses the impedance of the BIC in a low impedance path during normal mission operation and system functioning of the IC device. The invention is applicable to any CMOS or MOS circuit portions of MOS, CMOS and BICMOS IC devices.

BACKGROUND ART

The advantages of monitoring, testing and measuring static current through CMOS and MOS circuits of IC devices are now well documented. The level of static current or quiescent current variously referred to as IDDQ or ICCQ can be used to identify defective IC devices or devices likely to fail. Such static current testing provides substantially greater accuracy than traditional logical testing by voltage measurements, sometimes referred to as "stuck at fault" testing or functional testing.

IDDQ is the current that flows through a CMOS or MOS circuit from the high potential power rail VCC or VDD to the low potential power rail GND when all nodes are quiescent following switching transition events. Ideally, the static current should be zero. But, the less than ideal physical reality of structural conditions across an IC device result in a measurable static current flow from the high potential power rail VDD or VCC through various defect paths to the ground rail GND. Such defect paths are caused for example by gate oxide shorts between the source or drain and gate of MOS transistors, poly bridges and metal bridges between separate nodes, PN junction leakage, mobile ion contamination, "punch through" between source and drain, etc.

If the collective static current through defective paths exceeds an acceptable threshold current level selected for example in the range of 1 µA to 3 µA, the part can be identified as defective or likely to fail even though the part passes traditional logical function tests. An acceptable level or threshold of IDDQ may be selected within a wider range according to the wafer fabrication process. A recent study by Steven D. McEuen, "IDDQ BENEFITS", Ford Microelectronics Inc. 9965 Federal Drive, Colorado Springs, CO 80921, published in 1991 IEEE VLSI Test Symposium, Paper 14.1, pp 285–290, found that static current testing afforded over 50% greater effectiveness compared to traditional logical function testing in eliminating defective parts from the "good population". This dramatic increase in reliability and accuracy provided by IDDQ monitoring and current testing is confirmed by Tom Storey and Wojceich Maly, Carnegie Melon University, Pittsburgh, PA, USA and John Andrews and Myron Miske, National Semiconductor Corporation, South Portland, ME USA in the paper "Comparing Stuck Fault and Current Testing via CMOS Chip Test" published at the European Test Conference, Apr. 1991. IDDQ monitoring appears to be essential for approaching the goal of "Zero Defect" parts.

A disadvantage of static current testing with external automatic test equipment (ATE) is that such testers introduce substantial parasitic capacitance and inductive reactance increasing the time to quiescent conditions following switching events and slowing the rate of IDDQ testing. Static current measurement is made after a test vector is applied at selected inputs to the part. As many as 40 to several hundred different test vectors may be applied to the part followed by IDDQ measurements. Ideally the testing should be accomplished at a test frequency of at least 0.1 MHz and greater, for example 1 MHz. To achieve such test frequencies the foregoing studies recommend the use of so-called built-in current monitors (BIC) fabricated on the chip to reduce parasitic capacitance, inductance, and consequent delays.

Such a built-in current sensing circuit is described by M. Patyra and W. Maly, Carnegie Mellon University, Pittsburgh, PA, 15213 in the paper "Circuit Design for Built-In Current Testing" IEEE 1991 Custom Integrated Circuit Conference. The basic circuit concept is illustrated in FIG. 1 which is adapted from that paper. BIC sensors 10 monitor the amount of quiescent current in the ground lines of the CMOS functional units or modules 20 under test. As shown in FIG. 1 the basic structure of the BIC 10 includes a voltage drop device VDROP coupled between the CMOS circuit module 20 and the ground rail GND, and a voltage comparator VCOMP.

Each clock cycle the BIC monitor circuit 10 compares the virtual ground voltage VGND above VDROP with a voltage reference VREF. VREF is chosen so that VGND<VREF for defect free acceptable parts. For VGND>VREF, the quiescent current exceeds an acceptable threshold level and a fail signal F flags the CMOS circuit portion as defective.

A detailed circuit implementation of the BIC 10 is illustrated in FIG. 2. The voltage drop device VDROP is provided by bipolar transistor Q1. The comparator VCOMP is provided by MOS transistors M1–M7 and includes a current mirror that establishes VREF from a reference current IREF. The circuit implementation also includes a two stage amplifier M3,M8,I1, a NAND gate N1 and bistable edge sensitive latch LATCH, and a circuit breaker M9,M10,I2. The latch LATCH generates a fail flag signal F with a logic value "1" for a failure indication when VGND>VREF. The output value of F equals "0" for a no fault indication. The circuit breaker M9,M10,I2 also disconnects the failed CMOS circuit module or macrocell 20 from the ground rail GND.

A disadvantage of the Patyra and Maly BIC and similar built-in static current monitors, is the impact of the BIC on normal system operation of the part. The BIC circuit introduces an inevitable impedance in the ground path of the IC device with accompanying degradation of system function which cannot be eliminated. While Patyra and Maly seek to minimize the impact of the BIC sensor on circuit performance, the residual voltage drop across bipolar transistor Q1 remains.

Another example of a BIC circuit is described by A. Welbers et al., Philips Research Laboratories, P.O. Box 8000, 5600 J. A., Eindhoven, The Netherlands in a paper "A Built-In CMOS IDD Quiescent Monitor Circuit". However this BIC circuit is available for static current testing only during the manufacturing and testing phases. It is then apparently permanently bypassed by hard wiring and is not available for test use during the life of the chip.

The present invention seeks to overcome the degradation of system function caused by built-in current monitor and sensor circuits in the normal operation of IC devices. In order to accomplish this result, the present invention makes novel use of a standard test access port such as the IEEE Standard 1149.1 TAP. While it has been suggested that the built-in current monitor BIC may be combined with a boundary scan testing test access port TAP, this has been only for the purpose of applying test vectors for static current measurement using the boundary scan register of the test access port.

The test access port TAP defined by IEEE Standard 1149.1 Test Access Port and Boundary Scan Architecture and JTAG Version 2.0 Protocol for incorporation on an integrated circuit chip is illustrated in FIG. 3. At least four pins of the IC device and a varying percentage of the chip silicon surface area are dedicated to the test access port and associated TAP circuits. The TAP is intended to standardize and facilitate boundary scan testing and other design specific testing of the IC device while the chip is still mounted on a circuit board and without separate test instrumentation. The TAP permits all phases of testing with access at all pins of the IC device through boundary scan principles even for surface mount devices and without the necessity of "bed of nails" physical contact. Access to all pins for testing is achieved electronically through the boundary scan shift register, one of the test data registers of the test access port.

The dedicated pins for the test access port include a test data input (TDI) pin to receive data signals for the test data registers (TDRs) and to receive instruction codes for the test instruction register (TIR). The test data output (TDO) pin shifts out data signals from the TDRs and instruction codes from the TIR for example for input to the TDI pin of the next IC device on a circuit board. IEEE Standard 1149.1 compliant chips of a circuit board may be coupled with boundary scan registers in series in a "daisy chain" forming a selected test ring for test mode select functions. Data signals and instruction codes are shifted out from the TDRs and TIR to the TDO pin through respective multiplexers MUX, a latch or passgate, and an output buffer coupled to the TDO pin.

The remaining two required pins of the standard TAP are a test mode select (TMS) pin and a test clock (TCK) pin which provide respective control and clock signals to the TAP controller which in turn directs operation of the test access port. In response to TMS control signals and TCK clock signals, the TAP controller selects either the instruction register TIR for entry of an instruction code from the TDI pin, or selects a test data register (TDR) for entry of data signals from the TDI pin. According to the selected mode of operation, for example a test to be performed or a design specific procedure to be followed, the appropriate instruction code is shifted into the instruction register (TIR). The instruction code is decoded by instruction decode register (IDR) and the TIR selects one or more of the test data registers (TDRs) required for the selected test or procedure.

The minimum required TDRs include the boundary scan register TDR1 for performing boundary scan testing and the bypass register TDR2 for bypassing data signals and instruction codes to the TDO pin in order to bypass a particular chip for a selected test or other procedure. The test logic may also include design specific TDRs such as TDR4 illustrated in FIG. 3 for performing a customized or design specific test or system logic procedure. An optional TAP test logic reset (TRST,) pin may be dedicated for an asynchronous resetting of the TAP controller.

The central operating feature of the standard TAP is the boundary scan register TDR1 shown in more detail in FIG. 4. The boundary scan register TDR1 is a shift register of series coupled boundary scan cells (BSC). A boundary scan cell BSC is coupled at each pin of the IC device in the system logic path between the respective input or output pin and the IC device internal system logic. Under appropriate program control, data signals may be shifted into position through the boundary scan path of the boundary scan register for example for input to the IC device system logic at the input pins. The processed data signals may be latched at the boundary scan cells adjacent to output pins to be shifted out through the boundary scan path and TDO pin for test analysis. Each boundary scan cell (BSC) generally incorporates two flip-flops and two multiplexers for accomplishing these boundary scan test objectives. The boundary scan register and boundary scan test principles permit access to all pins of the IC device without physical contact by a "bed of nails" testing apparatus.

A more detailed fragmentary block diagram of the test access port data registers TDRs is illustrated in FIG. 5. FIG. 5 shows a bank of TDRs including the minimum required boundary scan register TDR1 and bypass register TDR2. An optional test data register is the device identification register TDR3 for coded identification of a device name. Additionally there may be a plurality of specialized design specific test data registers TDR4, TDR5 and TDRN etc. for design specific tests or procedures.

A state diagram showing the operation of the TAP controller for a standardized test access port is illustrated in FIG. 6. The TAP controller is an "n" state finite state machine, in this case a 16 state finite state machine composed of four flip flops which in combination determine the 16 states of the TAP controller. While inactive, the TAP controller remains in the Test Logic Reset state or condition. The TAP controller is held in this state as long as the TMS signal is logic high level 1 or the TRST* signal is logic low level o.

When the TMS pin changes from 1 to 0, a test procedure is initiated with transition to the Run Test/Idle state. From the Run Test/Idle condition, the TAP controller selects either the TAP test instruction register TIR or one of the TAP test data registers TDRs for shifting respective instruction codes or data signals into and from the captured register TDRN between the TDI and TDO pins. In the state diagram of FIG. 6, the binary digits accompanying the flow chart arrows represent the TMS signal. The indicated transition occurs for the specified value of the TMS signal at the next rising edge of a clock signal TCK. As used herein, the Test Logic Reset (TLR) state of the TAP controller is referred to as the inactive state. All other states of the TAP controller state diagram are referred to as the active state or active states.

Further background information and detailed instruction on the construction and operation of standardized test access ports are found in the following references: *IEEE STANDARD TEST ACCESS PORT AND BOUNDARY SCAN ARCHITECTURE*, Test Technology Technical Committee of the IEEE Computer Society, Institute of Electrical and Electronics Engineers, Inc., 345 East 47th Street, New York, N.Y. 10017 USA (May 21, 1990) (IEEE Standard 1149.1-1990); Colin M. Maunder and Rodham E. Tulloss, *THE TEST ACCESS PORT AND BOUNDARY SCAN ARCHITECTURE, IEEE* Computer Society Press Tutorial, IEEE Computer Society Press, 10662 Los Vaqueros Circle, P.O. Box 3014, Los Alamitos, Calif. 90720-1264 (IEEE 1990); John Andrews, "IEEE Standard Boundary Scan 1149.1", National Semiconductor Corporation, 333 Western Avenue, South Portland, Me. 04106, a paper delivered at WESCON, San Francisco, 1991.

As noted by Maunder and Tulloss, the design specific TAP test data registers (TDRs) can be part of the on-chip system logic or the test logic and can have both system and test functions. The dedicated test access port pins afford convenient access to the chip for example from a portable computer at an external location for testing or otherwise servicing the IC device in situ in its operating circuit board and environment.

According to the terminology adopted in this specification, the reference to the test access port or TAP includes the test logic as well as the dedicated pins of the TAP. The reference to "test" components and elements of the TAP is generalized to "TAP" components and elements to encompass both test logic functions and system logic functions for which the TAP might be used. Thus, the standard test data input pin, test data output pin, test mode select pin, test clock pin, test data registers, and test instruction register etc. may also be referred to herein more generally as TAP data input (TDI) pin, TAP data output (TDO) pin, TAP mode select (TMS) pin, TAP clock (TCK) pin, TAP test data registers (TDRs), and TAP instruction register (TIR) etc. This more generalized terminology is appropriate to objects and features of the present invention for implementation of the TAP components and elements whether used for test functions or design specific system logic functions of an IC device.

Objects of the Invention

It is therefore an object of the present invention to provide a built-in current monitor for sensing and measuring static current in CMOS and MOS circuit modules of IC devices and which is available for use over the life of an integrated circuit chip.

Another object of the invention is to provide an integrated circuit built-in current monitor which does not degrade the normal system operation of the integrated circuit device. During normal mission operation of the IC device, the BIC monitor circuit should be effectively invisible to the system logic.

A further object of the invention is to strategically combine the built-in current monitor BIC with a standard test access port TAP for controlling the impedance path through the BIC monitor circuit for high impedance during the test mode and for low impedance or essentially zero impedance during the normal IC device operating mode.

Disclosure of the Invention

In order to accomplish these results the invention provides a new TAP controlled BIC monitor for an IC device having a standard test access port and a built-in current monitor circuit coupled between an MOS or CMOS circuit module of the IC device and a low potential power rail GND. The BIC monitor is provided for testing static current IDDQ. According to the invention a bypass or shunt circuit is coupled in parallel with the BIC monitor. The bypass circuit has a low impedance conducting state and a high impedance conducting state and control means for controlling the conducting state of the bypass circuit. In the preferred example the bypass circuit is a bypass MOS transistor coupled with its primary current path in parallel with the BIC monitor between the CMOS circuit module and low potential power rail GND and the control means is the control gate node of the bypass MOS transistor.

The invention also provides user defined design specific TAP data registers for implementing the new TAP controlled BIC monitor circuit. A design specific BIC shunt control TAP data register BICSC TDR is constructed to receive a coded BIC monitor bypass code BICBC at the TDI pin. The BICSC TDR has an output coupled to the control means of the bypass circuit and in the preferred example, the control node of the MOS bypass transistor for controlling the conducting state of the MOS bypass transistor according to the BIC monitor bypass code BICBC. The MOS bypass transistor provides a low impedance bypass path around the BIC monitor in response to a first BICBC during normal operation of the IC device. The MOS bypass transistor presents a high impedance bypass path in response to a second BICBC for monitoring quiescent current IDDQ at the BIC monitor.

The invention provides a design specific BIC fault capture TAP data register BICFCP TDR coupled to the output of the BIC monitor for receiving and storing digitally coded fault signals F according to the monitored level of static current. The BICFCP TDR shifts out fault signals F to the TDO pin. Another user defined design specific TDR is optionally provided. The design specific IDDQ test vector TAP data register ITV TDR is coupled to receive IDDQ test vectors at the TDI pin. The ITV TDR is also coupled to internal nodes of the IC device CMOS circuit module to apply test vectors at the selected nodes for testing and sensing static current IDDQ from the CMOS circuit module. The BIC monitor circuit senses and measures IDDQ in response to application of the test vectors. Alternatively, test vectors can be applied to MOS and CMOS circuit portions of the IC device using the test access port boundary scan register BSR.

The invention is applicable to an IC device with a plurality of separate or separable MOS or CMOS circuit modules. A plurality of BIC monitors are coupled between the respective CMOS circuit modules and low potential power rail GND. A plurality of MOS bypass transistors have primary current paths coupled in parallel with the respective BIC monitors. The design specific BIC shunt control TAP data register BICSC TDR and BIC fault capture TAP data register BICFCP TDR are constructed with appropriate serial and parallel ports for controlling the respective MOS bypass transistors and BIC monitors.

According to the invention the user defined design specific TAP data register such as the BICSC TDR, the BICFCP TDR, and the ITV TDR may be constructed as separate TDR's or may be combined in various combinations as unitary TDR's. The invention also provides a new method of monitoring static current IDDQ from an MOS or CMOS circuit module coupled between high and low potential power rails of an IC device. The new method is based upon test access port control of the built-in current monitoring circuit including bypassing each BIC monitor by providing a low impedance bypass path around the BIC monitor during normal operation of the IC device and presenting a high impedance bypass path for monitoring quiescent current IDDQ at the BIC monitor.

Broadly conceived the present invention provides a bypass or shunt circuit coupled in parallel with the BIC monitor between the MOS or CMOS circuit module and low potential power rail GND. The bypass circuit is constructed to provide a low impedance bypass path around the BIC monitor in response to a first BIC bypass control code BICBC during normal system operation of the IC device. The bypass circuit presents a high impedance bypass path in response to a second BIC bypass control code BICBC for monitoring quiescent current IDDQ at the BIC monitor. The design specific BIC shunt control TDR, BICSC TDR, is constructed for switching the conducting state of the bypass circuit between low and high impedance conditions.

Other objects, features, and advantages are apparent in the following specification and accompanying drawings.

DESCRIPTION OF PREFERRED EXAMPLE EMBODIMENTS AND BEST MODE OF THE INVENTION

Figure 6:
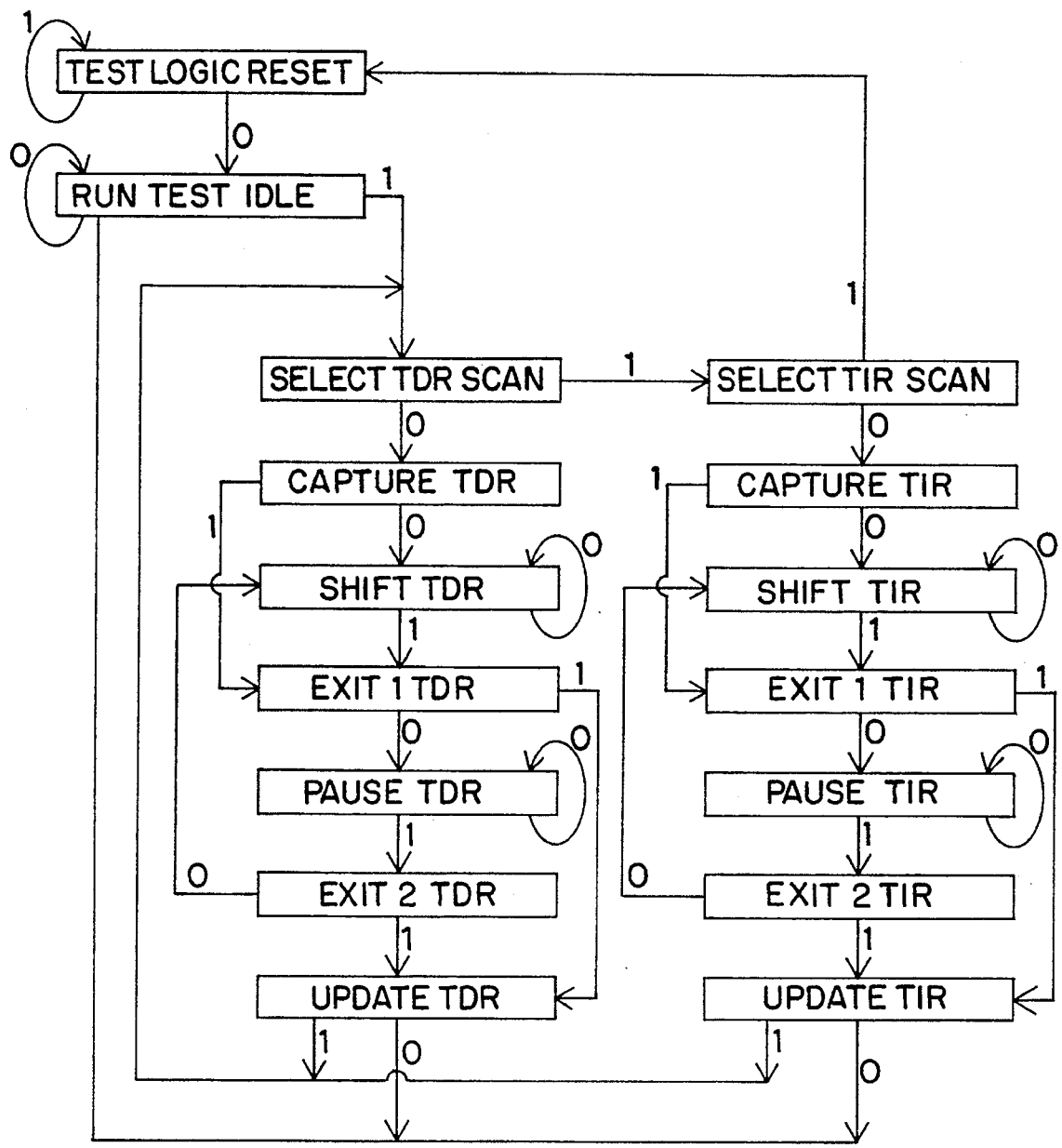
FIG. 6 is a detailed block diagram flow chart showing the state diagram of the TAP controller of an IEEE Standard 1149.1 compliant test access port.
Figure 7:
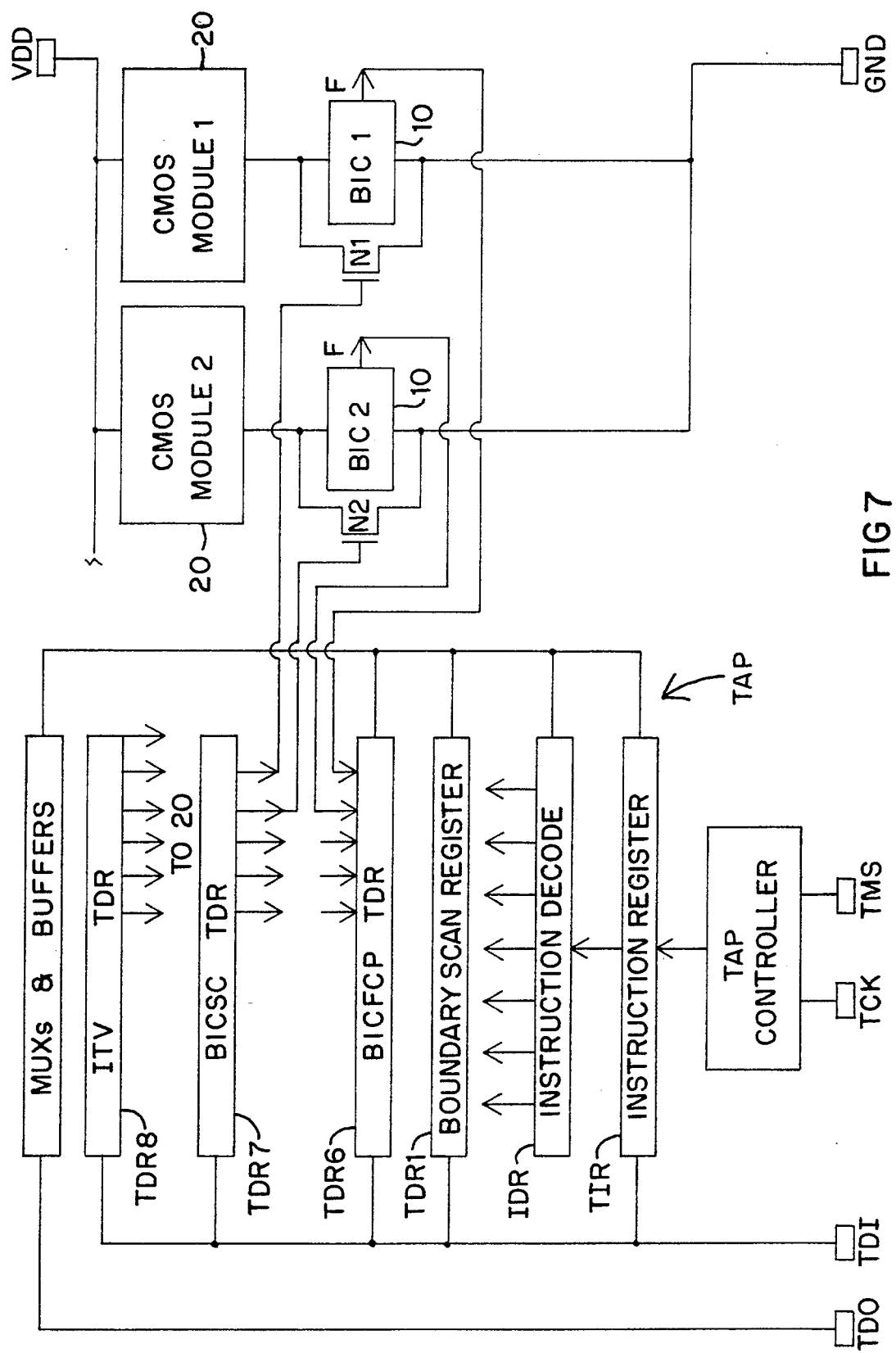
FIG. 7 is a detailed block diagram of a TAP controlled BIC monitor circuit according to the invention with multiple user defined design specific TAP data registers to be used during static current testing and monitoring.

An IC device incorporating a TAP controlled built-in current monitoring system according to the invention is illustrated in FIG. 7. Circuit components and blocks of the detailed block diagram of FIG. 7 performing substantially the same or similar functions described above with reference to FIGS. 1–6 are indicated by the same reference numerals or reference designations. In this example the IC device incorporates a plurality of CMOS circuit modules or macrocells 20. The number of separate or separable CMOS modules 1,2, . . . , N may vary according to the requirements of for example an application specific IC (ASIC) device. A plurality of BIC monitors 10 are also provided coupled respectively between the separate or separable CMOS circuit modules 20 and the low potential power rail GND for monitoring static current IDDQ. The number of BIC monitors 1,2, . . . ,N varies according to the requirements for monitoring the quiescent current through the respective separate or separable CMOS modules 20. The IC device also incorporates a test access port TAP with the required elements according to IEEE Standard 1149.1 Test Access Port and Boundary Scan Architecture all as described above.

In order to avoid degradation of the normal mission operation of the IC device, a plurality of NMOS shunt or bypass transistors N1,N2, . . . ,NN are incorporated in the BIC monitoring circuit. The number of NMOS bypass transistors N1,N2, . . . , NN may vary according to the number of required bypass paths around the respective BIC monitors 10. The MOS bypass transistors N1,N2 have primary current paths coupled in parallel with the respective BIC monitors 10 between the respective CMOS circuit modules 20 and low potential power rail GND.

The test access port is constructed with several new design specific or user defined TAP data registers designed for controlling the BIC monitoring system. In the example of FIG. 7 these are identified as TDR6,TDR7, and TDR8. TDR7 of the test access port TAP is a new design specific BIC shunt control TAP data register BICSC TDR constructed for receiving a coded BIC monitor bypass code BICBC at the TDI pin. The BICBC is serially shifted into the BICSC TDR through a serial port input. The BICSC TDR may be for example a 16 bit or 20 bit register provided with a parallel port output. The parallel outputs of the BICSC TDR are coupled respectively to the control nodes or gates of the respective NMOS bypass transistors (N1,N2, . . . NN) for controlling the conducting states of the NMOS bypass transistors according to the BIC monitor bypass code BICBC.

In its simplest form the series of binary bits of the BIC monitor bypass code BICBC include one bit controlling each bypass transistor N1,N2, . . . ,NN. The NMOS transistor provides a low impedance or effectively zero impedance bypass path around the respective BIC monitor 10 in response to a first BICBC having a "1" value. Typically all of the BIC monitors 10 are bypassed by "1" codes during normal operation of the IC device. The NMOS bypass transistors N1,N2, . . . , NN present a high impedance bypass path in response to a second BICBC having a "0" value. The high impedance path forces quiescent current through the voltage drop of the respective BIC monitors 10 for monitoring quiescent current IDDQ from the respective CMOS modules 20 at the respective BIC monitors 10 during a test operating mode.

Figure 1:
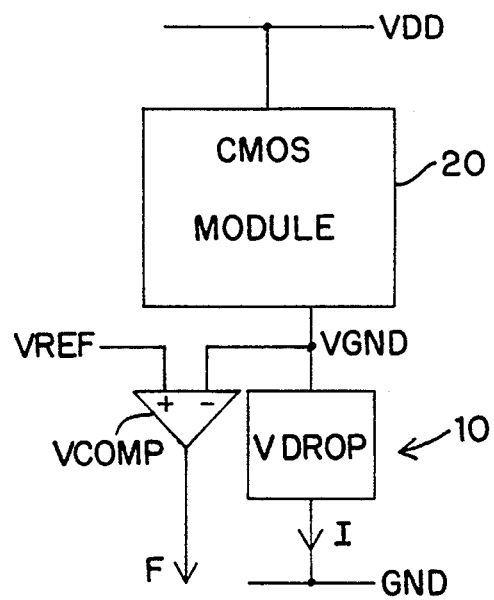
FIG. 1 is a block diagram of a standard built-in current monitor BIC for fabrication on an integrated circuit chip such as a CMOS, MOS, or BICMOS IC device having CMOS or MOS circuit portions to be tested.
Figure 2:
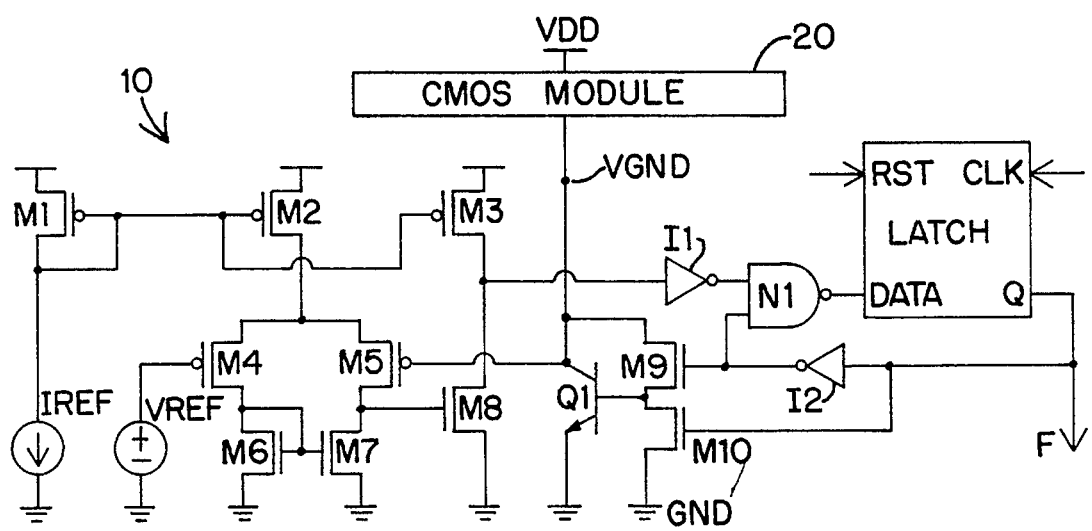
FIG. 2 is a detailed schematic circuit diagram of a built-in current sensor circuit implementing the BIC monitor of FIG. 1.

Each of the BIC monitors 10 of FIG. 7 may be constituted for example by the BIC monitor circuit of FIGS. 1 and 2. Each BIC monitor circuit 10 therefore provides a digital output fault signal F. The fault signal F has a logical value "1" for sensed quiescent current IDDQ or ICCQ exceeding an acceptable threshold current level and indicating a defective CMOS module or circuit portion 20. The fault signal F has a logic value "0" if the measured static current remains within acceptable limits for example less than a threshold current level selected in the range of 1–3 μA.

The test access port TAP is also constructed with a second new design specific BIC fault capture TAP data register BICFCP TDR, also designated TDR6. The BIC fault capture TDR is constructed with a parallel port input to the respective stages of TDR6 in turn coupled to the respective outputs of the BIC monitors 10 for receiving and storing the fault signals F. The BICFCP TDR also incorporates a serial port output for serially shifting out the fault signals F for analysis at the TDO pin.

In order to test for IDDQ at the BIC monitors 10 during the test operating mode when the bypass transistors N1,N2, . . . ,NN are not conducting, a test vector of voltage signals must be applied at selected inputs or nodes of the CMOS modules. This can be accomplished by applying the test vector through the boundary scan register BSR of the test access port designated TDR1. IDDQ sensing occurs during the steady state condition following the switching events associated with applying the test vector.

Alternatively, according to the invention one or more new design specific test data registers can be incorporated in the test access port for applying test vectors at internal nodes of the respective CMOS modules. In the example of FIG. 7 the design specific TAP data register designated TDR8 performs this function. TDR8 is referred to as the IDDQ test vector TDR or ITV TDR. The ITV TDR is coupled to receive a test vector at the TDI pin through a serial input port. TDR8 may be provided with a parallel output port coupling respective stages of the ITV TDR to internal nodes of a CMOS module for stimulating the CMOS circuit portion with the test vector. While a plurality of such design specific ITV TDR's may be provided a single example TDR8 is shown in FIG. 7. This TAP data register TDR8 will be coupled through portions of the integrated circuit to the selected nodes of respective CMOS circuit modules.

Figure 8:
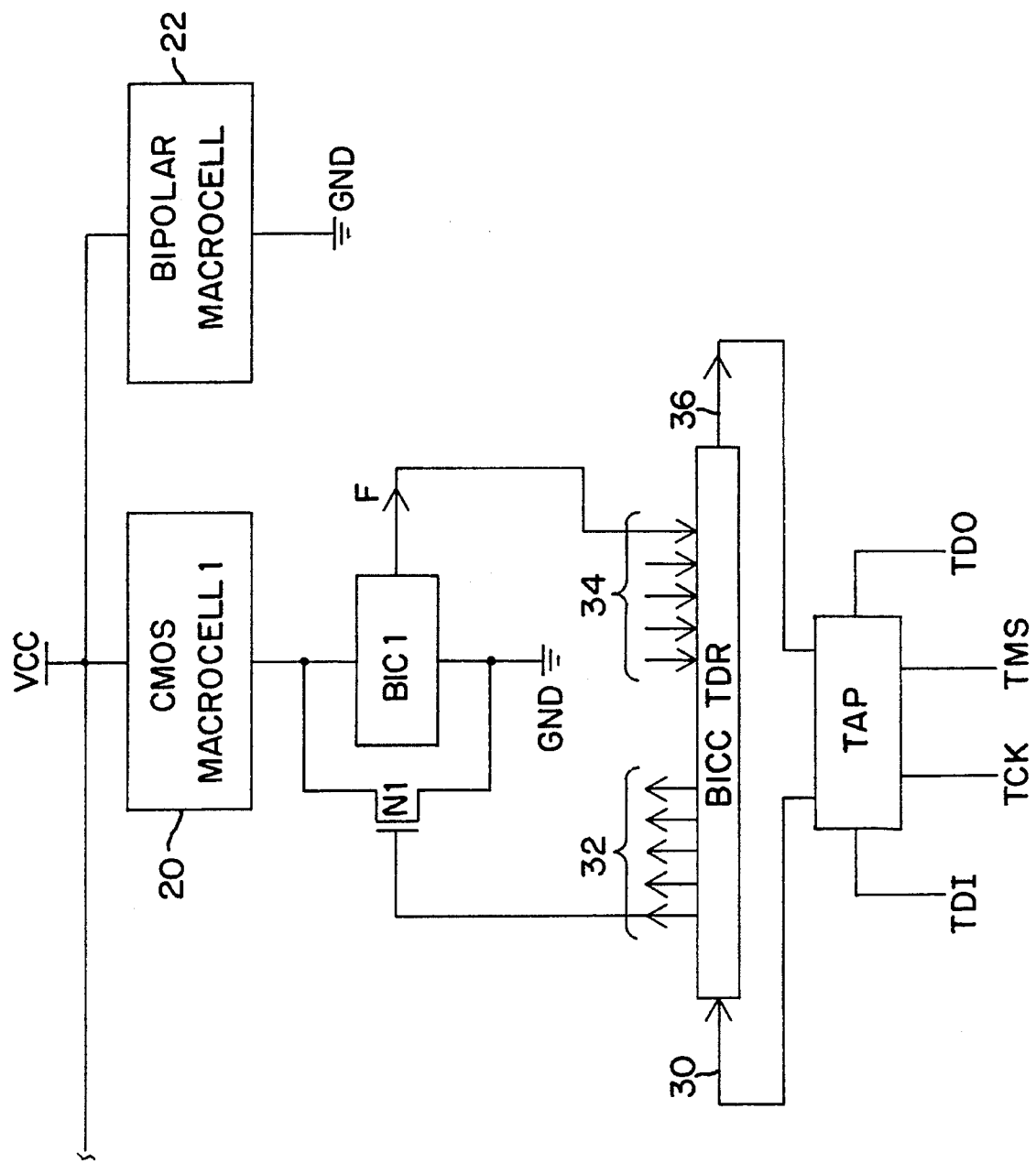
FIG. 8 is a simplified block diagram of an alternative TAP control BIC monitor with only a single user defined design specific TDR used for static current testing and measuring.

An alternative embodiment of the TAP controlled BIC monitoring system is illustrated in FIG. 8. A single example of a CMOS macrocell 20, BIC monitor 10, and bypass transistor N1 are illustrated in FIG. 8. The IC device may of course incorporate multiple CMOS macrocells 20, multiple BIC monitors 10 and multiple bypass transistors N1,N2, .. . ,NN. In the example of FIG. 8 the test access port incorporates only a single new design specific TAP data register for controlling static current monitoring. The new BIC control TDR is designated BICC TDR, a single TDR that consolidates the functions of both the BIC shunt control TDR7, BICSC TDR, and the BIC fault capture TDR6, BICFCP TDR.

The single BIC control TAP data register is constructed with a serial input port 30 for shifting in the BIC monitor bypass code BICBC and a parallel port output 32 for applying control signal bits at the control nodes of the respective bypass transistors N1,N2, . . . ,NN. After coordinating the respective on and off conditions of the bypass paths around the BIC current monitors 10, the BICC TDR then functions as the BIC fault capture TDR. The binary coded fault signals F are received at the parallel inputs of the parallel input port 34 for temporary storage in the BICC TDR. The fault signals F are then serially shifted out from the serial output port 36 to the TDO pin.

As shown in FIG. 8 the IC device may be a BICMOS IC device with separable CMOS and bipolar macrocells, modules or circuit portions. In this example the static current of the bipolar macrocell 22 is not monitored because of the relatively high level of static current that normally flows through the bipolar circuit cells. Under appropriate conditions, however, the TAP controlled BIC monitor can be used for testing static current through bipolar circuits also using a normalized relative measurement standard.

The sequence of operation of the TAP controlled built-in current monitoring system illustrated in FIGS. 7 and 8 is described with reference to the TAP controller state diagram of FIG. 6. An IDDQ test mode is initiated by loading a proper instruction in the TAP instruction register TIR at the "shift TIR" step. The IDDQ test instruction is applied during the update TIR sequence. As a result a IDDQ test vector is shifted into the appropriate TDR, either the boundary scan register TDR1 of FIG. 7 or the design specific IDDQ test vector TAP data register TDR8 during the shift TDR step. The test vector is applied to stimulate the respective CMOS circuit module during the update TDR sequence. The BIC monitors are previously prepared by a similar sequence through the TAP controller state diagram in which an instruction directs loading of the BIC monitor bypass code BICBC into the BIC shift control TDR, TDR7 for controlling the conductive state of the respective bypass transistors. After completion of static current monitoring another instruction directs capture of TDR6, the BIC fault signal capture TDR for shifting and storing false signals F in the BICFCP TDR, TDR6. In the example of FIG. 8 the same BIC control TDR BICC TDR is used for both functions.

Figure 3:
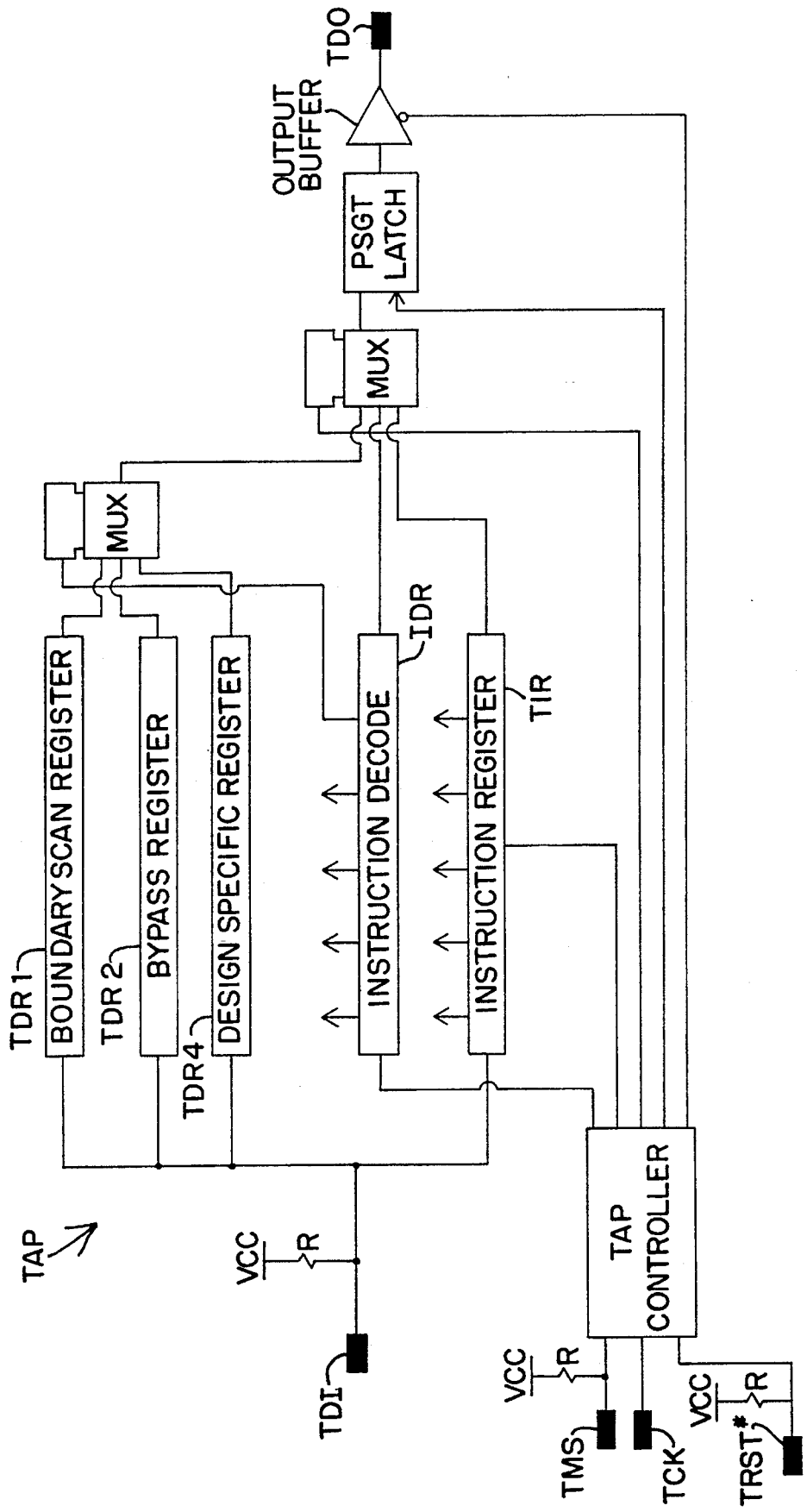
FIG. 3 is a schematic block diagram of an IC device test access port which conforms with the requirements of IEEE Standard 1149.1 Test Access Port and Boundary Scan Architecture JTAG Protocol Version 2.0.
Figure 4:
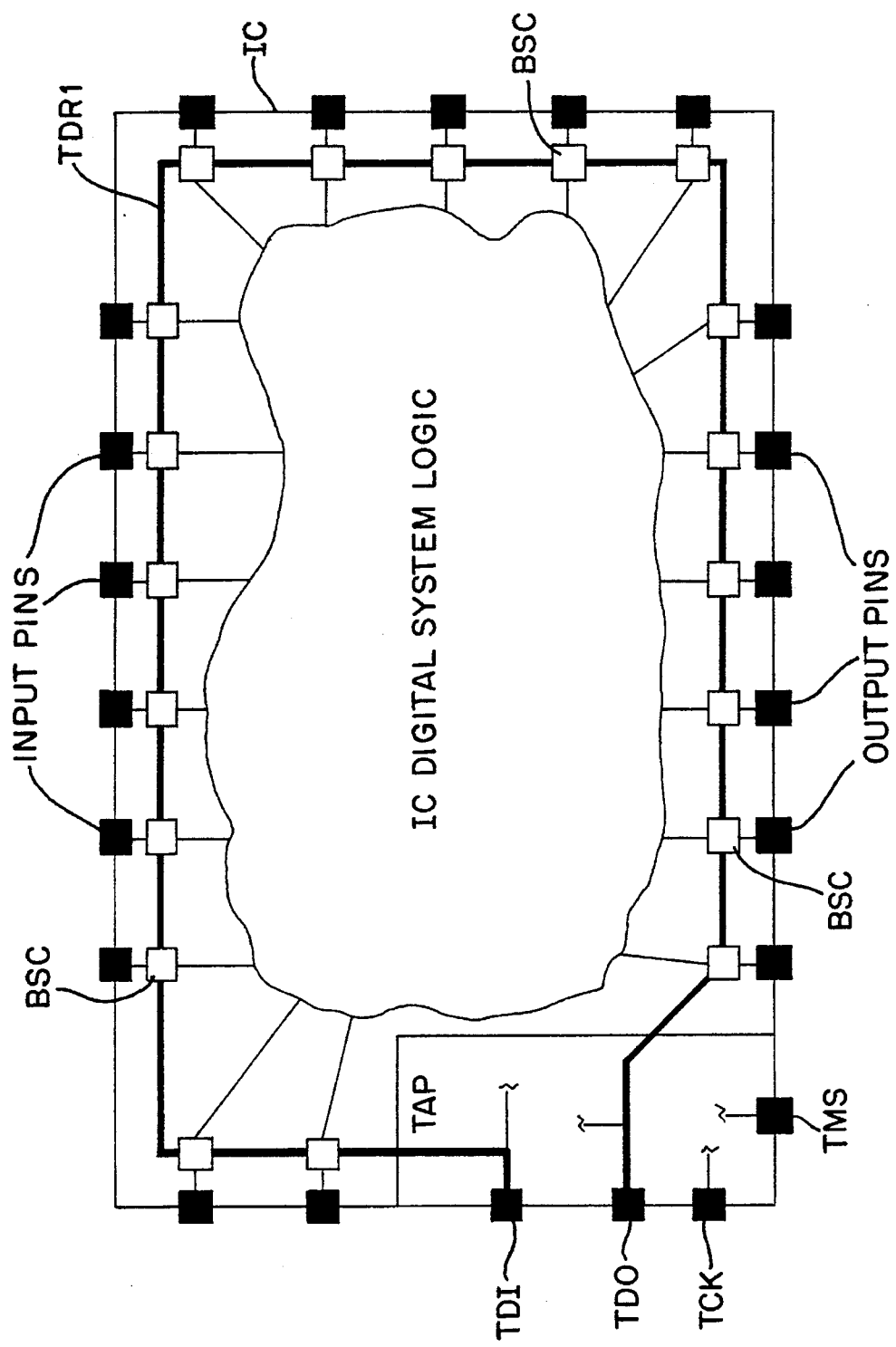
FIG. 4 is a detailed schematic block diagram of an example boundary scan register BSR TDR1 for the test access port of FIG. 3 showing the location of the boundary scan cells BSC's.
Figure 5:
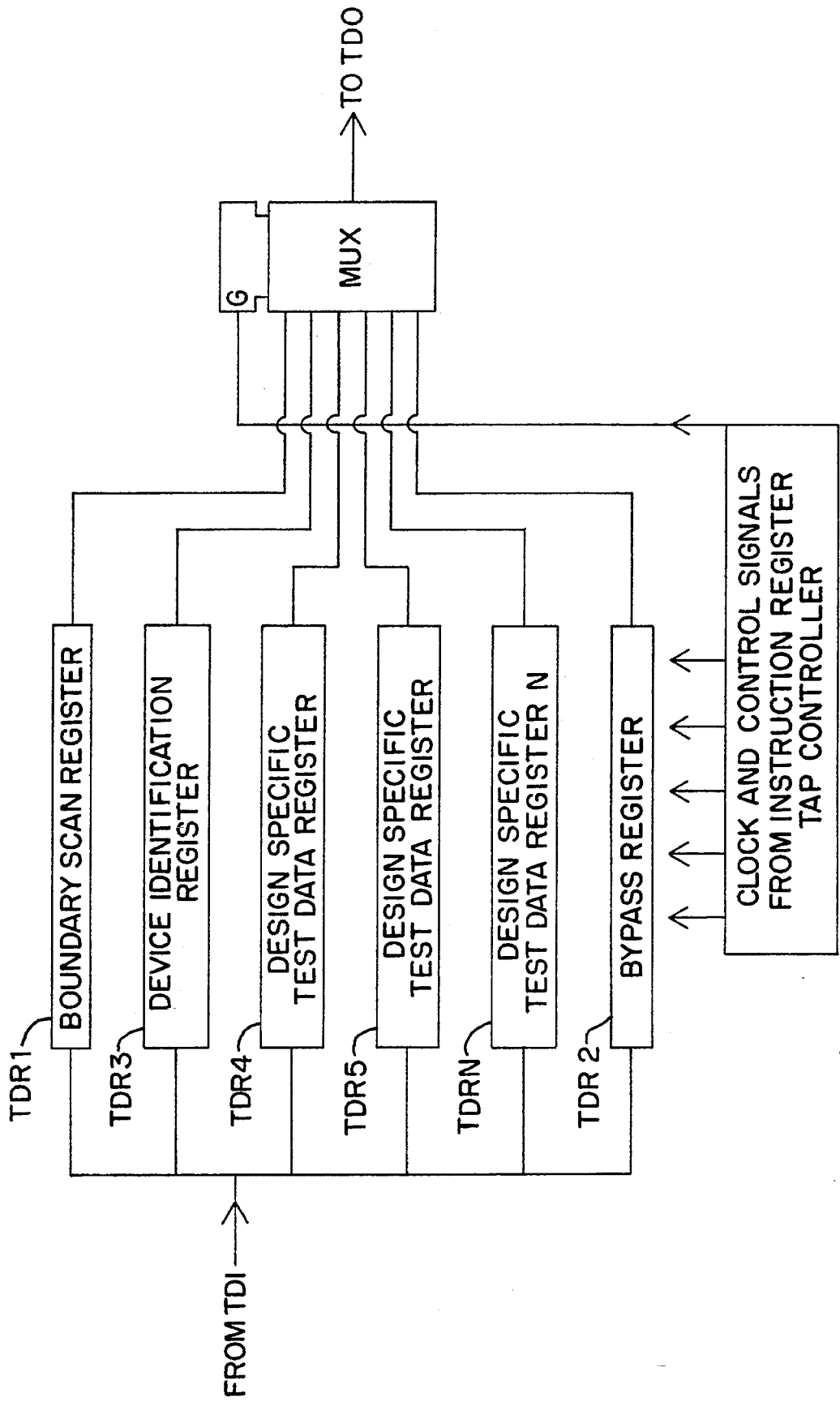
FIG. 5 is a detailed schematic block diagram of the TAP data registers TDR1 . . . TDRN for an IEEE Standard 1149.1 compliant test access port.

According to yet a third alternative embodiment of the invention the TAP instruction register TIR and instruction decode register IDR as shown in FIG. 3 can be used to control separate flip flops not shown which function as further decoders to control the conducting states of the NMOS bypass transistors N1,N2, . . . , NN. The dedicated flip flops can turn on and off the bypass transistors providing a low impedance path around the BIC monitors during normal system operation of the IC device. Alternatively the bypass transistors can be turned off for static current monitoring during IDDQ test mode operation. The dedicated flip flops provide independent control of each of the shunt transistors.

A number of variations of the TAP controlled BIC monitor are apparent from the specification. For example instead of a single bit binary fault signal output F at the outputs of the BIC monitors, an analog to digital A/D converter can be provided at the respective outputs of the BIC monitors 10 for delivering multi-bit binary digital signals and coding different current levels. More complex digital signals can be used, for example, for categorizing parts over a range of static current levels. Bipolar static current measurements can be made for bipolar circuit modules by making measurements relative to a normalized measurement standard. A single design specific or user defined TAP data register can be constructed to perform two of the functions or all three functions of applying an IDDQ test vector, controlling the conducting state of the bypass transistors according to the BIC monitor bypass code, and capturing and storing coded output fault signals F from the outputs of the respective BIC monitors. In the preferred example described above, however, separate user defined TDR's are provided for performing the three separate functions.

Software for managing a standard test access port according to IEEE Standard 1149.1 and JTAG Version 2.0 is available from companies such as Teradyne, Hewlett Packard, and Alpine Image Systems. Teradyne provides the "Victory" (Trademark) software package for "virtual in circuit testing". The "Victory" (Trademark) software may be used for loading the BIC monitor bypass codes BICBC into the design specific BIC shunt control TAP data register BICSC TDR and for loading and unloading fault signal codes F from the BIC fault capture TAP data register BICFCP TDR.

While the invention is described with reference to particular example embodiments it is intended to cover all modifications and equivalents within the scope of the following claims.

I claim:

1. An integrated circuit (IC) device comprising:

a MOS or CMOS circuit module coupled between high and low potential power rails;

a built in current (BIC) monitor coupled between the MOS or CMOS circuit module and a low potential power rail for monitoring the level of static or quiescent current (IDDQ), said BIC monitor being constructed to provide a digital code fault signal at an output according to the monitored level of static current (IDDQ);

a test access port (TAP) with TAP access pins including a TAP data input (TDI) pin and a TAP data output (TDO) pin, said test access port having a plurality of TAP data registers (TDR's) coupled to receive data signals at the TDI pin and to shift data signals to the TDO pin, said TDR's including a boundary scan register (BSR/ TDR1) for applying test vectors at data inputs of the IC device for performing boundary scan testing, a TAP instruction register (TIR) coupled to receive instruction codes at the TDI pin and to direct use of selected TDR's, and a TAP controller coupled to receive control and clock signals and to direct control and clock signals controlling operation of the TIR and TDR's;

a bypass or shunt MOS transistor having primary current path coupled in parallel with the BIC monitor between the MOS or CMOS circuit module and low potential power rail;

said TDR's comprising a design specific BIC shunt control TDR (BICSC TDR) constructed for receiving a coded BIC monitor bypass code (BICBC) at the TDI pin, said BICSC TDR having an output coupled to a control node of the MOS bypass or shunt transistor for controlling the conducting state of the MOS bypass or shunt transistor according to the BIC monitor bypass code (BICBC);

said MOS bypass or shunt transistor providing a low impedance bypass path around the BIC monitor in response to a first BICBC during normal operation of the IC device, said MOS bypass or shunt transistor presenting a high impedance bypass path in response to a second BICBC for monitoring quiescent current at the BIC monitor.

2. The IC device of claim 1 wherein the TDR's comprise a design specific BIC fault capture TDR (BICFCP TDR) coupled to an output of the BIC monitor for receiving and storing digitally coded fault signals according to the monitored level of static current and for shifting out digitally coded fault signals to the TDO pin.

3. The IC device of claim 2 wherein the TDR's of the test access port comprise a design specific IDDQ test vector (ITV) TDR coupled to internal nodes of the IC device CMOS circuit module, said ITV TDR being coupled to receive IDDQ test vectors at the TDI pin and to apply IDDQ test vectors at selected nodes of the MOS or CMOS circuit module for testing and sensing the level of static current IDDQ at the BIC monitor in response to application of the IDDQ test vectors.

4. The IC device of claim 2 wherein the IC device comprises a plurality of MOS or CMOS circuit modules, a plurality of BIC monitors coupled between the respective MOS or CMOS circuit modules and the low potential power rail, and a plurality of bypass or shunt MOS transistors having primary current paths coupled in parallel with the respective BIC monitors;

wherein the design specific BIC shunt control TDR (BICSC TDR) comprises a serial port input coupled to the TDI pin for receiving a coded BIC monitor bypass code (BICBC) for selectively controlling the plurality of bypass or shunt MOS transistors, and a parallel output port having parallel outputs coupled to respective control nodes of the plurality of MOS bypass or shunt transistors;

and wherein the BIC fault capture TDR (BICFCP TDR) comprises a serial port output coupled to the TDO pin and a parallel port input having parallel inputs coupled to respective outputs of the plurality of BIC monitors for receiving and storing digitally coded fault signals and for shifting out digitally coded fault signals to the TDO pin.

5. The IC device of claim 4 wherein the TDR's of the test access port comprise a design specific IDDQ test vector (ITV) TDR coupled to internal nodes of the IC device MOS or CMOS circuit module, said ITV TDR being coupled to receive IDDQ test vectors at the TDI pin and to apply the IDDQ test vectors at selective nodes of the CMOS circuit module for testing and sensing the level of static current IDDQ at the BIC monitor in response to application of the IDDQ test vectors.

6. The integrated circuit device of claim 1 wherein the IC device comprises:

a plurality of MOS or CMOS circuit modules;

a plurality of BIC monitors coupled between the respective MOS or CMOS circuit modules and low potential power rail;

and a plurality of MOS bypass or shunt transistors having primary current paths coupled in parallel with respective BIC monitors;

wherein the design specific BIC shunt control TDR (BICSC TDR) comprises a serial port input coupled to the TDI pin for receiving a coded BIC monitor bypass code (BICBC) at the TDI pin for controlling the respective MOS bypass or shunt transistors, and a parallel output port having parallel outputs coupled to respective control nodes of the plurality of MOS bypass or shunt transistors;

and wherein the BIC shunt control TDR (BICSC TDR) further comprises a BIC fault capture TDR (BICFCP TDR) as a single BIC control TAP data register (BICC TDR), said BICC TDR further comprising a serial port output coupled to the TDO pin and a parallel port input having parallel inputs coupled to respective outputs of the plurality of BIC monitors for receiving and storing digitally coded fault signals according to the monitored level of static current in the respective MOS or CMOS circuit modules and for shifting out digitally coded fault signals to the TDO pin.

7. The IC device of claim 6 wherein the TDR's of the test access port comprise a design specific IDDQ test vector (ITV) TDR coupled to internal nodes of the IC device MOS or CMOS circuit module, said ITV TDR being coupled to receive IDDQ test vectors at the TDI pin and to apply the IDDQ test vectors at selective nodes of the MOS or CMOS circuit module for testing and sensing the level of static current IDDQ at the BIC monitor 10 in response to application of the IDDQ test vectors.

8. An integrated circuit device having CMOS circuit modules coupled between high and low potential power rails, at least one built-in current (BIC) monitor coupled between a CMOS circuit module and low potential power rail for monitoring the level of static or quiescent current (IDDQ) said BIC monitor being constructed to provide a digital code fault signal at an output according to the monitored level of static current (IDDQ), and a test access port (TAP) with TAP access pins including a TAP data input (TDI) pin and a TAP data output (TDO) pin, said test access port having a plurality of TAP data registers (TDR's) coupled to receive data signals at the TDI pin and to shift data signals to the TDO pin, said TDR's including a boundary scan register (BSR/TDR1) for applying test vectors at data inputs of the IC device for performing boundary scan testing, a TAP instruction register (TIR) coupled to receive instruction codes at the TDI pin and to direct use of selected TDR's, and a TAP controller coupled to receive control and clock signals and to direct control and clock signals controlling operation of the TIR and TDR's, comprising:

a MOS bypass transistor having a primary current path coupled in parallel with the BIC monitor between the CMOS circuit module and low potential power rail;

said TDR's comprising a design specific BIC shunt control TDR (BICSC TDR) constructed for receiving a coded BIC monitor bypass code (BICBC) at the TDI pin, said BICSC TDR having an output coupled to a control node of the MOS bypass transistor for controlling a conducting state of the MOS bypass transistor according to the coded BIC monitor bypass code (BICBC);

said MOS bypass transistor providing a low impedance bypass path around the BIC monitor in response to a first BICBC during normal operation of the IC device, said MOS bypass transistor presenting a high impedance bypass path in response to a second BICBC for monitoring the level of static current (IDDQ) at the BIC monitor;

said TDR's also comprising a design specific BIC fault capture TDR (BICFCP TDR) coupled to an output of the BIC monitor for receiving and storing digitally coded fault signals according to the monitored level of static current (IDDQ) and for shifting out fault signals to the TDO pin.

9. The IC device of claim 8 wherein the TDR's of the test access port comprise a design specific IDDQ test vector (ITV) TDR coupled to internal nodes of the IC device CMOS circuit module, said ITV TDR being coupled to receive IDDQ test vectors at the TDI pin and to apply the IDDQ test vectors at selective nodes of the CMOS circuit module for testing and sensing the level of static current IDDQ at the BIC monitor in response to application of the IDDQ test vectors.

10. A method of monitoring the level of static current (IDDQ) from a MOS or CMOS circuit module coupled between high and low potential power rails of an integrated circuit (IC) device, said IC device having a test access port (TAP) with TAP access pins including a TAP data input (TDI) pin and a TAP data output (TDO) pin, said test access port having a plurality of TAP data registers (TDR's) coupled to receive data signals at the TDI pin and to shift data signals to the TDO pin, said TDR's including a boundary scan register (BSR/TDR1) for applying test vectors at the inputs of the IC device for performing boundary scan testing, a TAP instruction register (TIR) coupled to receive instruction codes at the TDI pin and to direct use of selected TDR's, and a TAP controller coupled to receive control and clock signals and to direct control and clock signals controlling operation of the TIR and TDR's, said IC device also having a built-in current (BIC) monitor coupled between the MOS or CMOS circuit module and low potential power rail, said method comprising:

bypassing each BIC monitor using a bypass or shunt circuit coupled in parallel with the BIC monitor between the CMOS circuit module and low potential power rail;

controlling the conducting state of the bypass or shunt circuit using a design specific BIC shunt control TDR (BICSC TDR) of the test access port (TAP) constructed for receiving a coded BIC monitor bypass code (BICBC) at the TDI pin and coupled to the bypass or shunt circuit for controlling the conducting state of the bypass or shunt circuit according to the coded BIC monitor bypass code (BICBC);

providing a low impedance bypass path around the BIC monitor through the bypass or shunt circuit in response to a first BICBC during normal operation of the IC device;

presenting a high impedance bypass path through the bypass or shunt circuit in response to a second BICBC for monitoring the level of static current (IDDQ) at the BIC monitor during a test mode operation.

11. The method of claim 10 further comprising the step of storing digitally coded fault signals from the output of the BIC monitor according to the monitored level of static current (IDDQ) from the MOS or CMOS circuit module using a design specific BIC fault capture TDR (BICFCP TDR) of the test access port and shifting out fault signals from the BICFCP TDR to the TDO pin.

12. The method of claim 11 comprising the further steps:

applying a test vector for monitoring and testing static current (IDDQ) from the MOS or CMOS circuit module by using a design specific IDDQ test vector (ITV) TDR of the test access port (TAP) coupled to internal nodes of the MOS or CMOS circuit module and sensing and measuring the level of IDDQ at the BIC monitor after applying the test vector.

13. The method of claim 11 wherein the bypass or shunt circuit is a MOS bypass transistor having a primary current path coupled in parallel with the BIC monitor and wherein the BICSC TDR is coupled to a control gate node of the MOS bypass transistor.

14. The method of claim 13 comprising:

a plurality of MOS or CMOS circuit modules;

monitoring static current (IDDQ) from said plurality of MOS or CMOS circuit modules using a plurality of BIC monitors coupled between the respective MOS or CMOS circuit modules and the low potential power rail, and using a plurality of bypass MOS transistors having primary current paths coupled in parallel with the respective BIC monitors;

controlling conducting states of the plurality of bypass MOS transistors using a design specific BIC shunt control TDR (BICSC TDR) having a serial port input coupled to the TDI pin for receiving a coded BIC monitor bypass code (BICBC) for selectively controlling the plurality of bypass MOS transistors and a parallel output port having parallel outputs coupled to respective control nodes of the plurality of MOS bypass transistors;

and receiving digitally coded fault signals (F) from the outputs of the plurality of BIC monitors using a BIC fault capture TDR (BICFCP TDR) having a serial port output coupled to the TDO pin and a parallel port input coupled to respective outputs of the plurality of BIC monitors for receiving and storing digitally coded fault signals and for shifting out digitally coded fault signals to the TDO pin.

15. An integrated circuit device comprising:

a MOS or CMOS circuit module coupled between high and low potential power rails;

a built in current (BIC) monitor coupled between the MOS or CMOS circuit module and low potential power rail for monitoring the level of static or quiescent current (IDDQ), said BIC monitor being constructed to provide a digital code fault signal at an output according to the monitored level of static or quiescent current (IDDQ);

a test access port (TAP) with TAP access pins including a TAP data input (TDI) pin and a TAP data output (TDO) pin, said test access port having a plurality of TAP data registers (TDR's) coupled to receive data signals at the TDI pin and to shift data signals to the TDO pin, said TDR's including a boundary scan register (BSR/TDR1) for applying test vectors at data inputs of the IC device for performing boundary scan testing, a TAP instruction register (TIR) coupled to receive instruction codes at the TDI pin and to direct use of selected TDR's, and a TAP controller coupled to receive control and clock signals and to direct control and clock signals controlling operation of the TIR and selected TDR's;

a bypass or shunt circuit coupled in parallel with the BIC monitor between the MOS or CMOS circuit module and low potential power rail said bypass or shunt circuit having a low impedance conducting state and a high impedance conducting state and control means for controlling the conducting state of the bypass or shunt circuit;

said TDR's comprising a design specific BIC shunt control TDR (BICSC TDR) constructed for receiving a coded BIC monitor bypass code (BICBC) at the TDI pin, said BICSC TDR having an output coupled to the control means for controlling the conducting state of the bypass or shunt circuit according to the coded BIC monitor bypass code (BICBC);

said bypass or shunt circuit providing a low impedance bypass path around the BIC monitor in response to a first BICBC during normal operation of the IC device, said bypass circuit presenting a high impedance bypass path in response to a second BICBC for monitoring the level of static or quiescent current (IDDQ) at the BIC monitor.

16. The IC device of claim 15 wherein the TDR's comprise a design specific BIC fault capture TDR (BICFCP TDR) coupled to the output of the BIC monitor for receiving and storing digitally coded fault signals according to the monitored level of static current IDDQ and for shifting out digitally coded fault signals to the TDO pin.

17. The IC device of claim 16 wherein the TDR's of the test access port comprise a design specific IDDQ test vector (ITV) TDR coupled to internal nodes of the IC device MOS or CMOS circuit module, said ITV TDR being coupled to receive IDDQ test vectors at the TDI pin and to apply IDDQ test vectors at selected nodes of the CMOS circuit module for testing and sensing the level of static current IDDQ at the BIC monitor in response to application of the IDDQ test vectors.

18. The IC device of claim 15 wherein the bypass or shunt circuit comprises a bypass MOS transistor having primary current path coupled in parallel with the BIC monitor and wherein the control means comprises a control gate node of the bypass MOS transistor.

* * * * *